United States Patent
Greimel-Rechling

(10) Patent No.: US 8,264,275 B2
(45) Date of Patent: Sep. 11, 2012

(54) AMPLIFIER ARRANGEMENT AND METHOD FOR SIGNAL AMPLIFICATION

(75) Inventor: Bernhard Greimel-Rechling, Ilz (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 12/997,870

(22) PCT Filed: May 27, 2009

(86) PCT No.: PCT/EP2009/056473
§ 371 (c)(1),
(2), (4) Date: Mar. 14, 2011

(87) PCT Pub. No.: WO2009/150056
PCT Pub. Date: Dec. 17, 2009

(65) Prior Publication Data
US 2011/0163802 A1   Jul. 7, 2011

(30) Foreign Application Priority Data
Jun. 11, 2008 (DE) .......... 10 2008 027 765

(51) Int. Cl.
*H03F 3/38* (2006.01)
(52) U.S. Cl. ............... 330/10
(58) Field of Classification Search ......... 330/10, 330/207 A, 251
See application file for complete search history.

(56) References Cited

U.S. PATENT DOCUMENTS
4,600,891 A    7/1986  Taylor
5,917,369 A    6/1999  Nguyen
6,621,335 B2 *  9/2003  Andersson .......... 330/10
6,980,058 B2   12/2005  Noro
2006/0097784 A1  5/2006  Lind

FOREIGN PATENT DOCUMENTS
EP    1 003 280    11/1999

OTHER PUBLICATIONS

J. Honda et al., "Application Note AN-1071-Class D Audio Amplifier Basics", International Rectifier, El Segundo, California, pp. 1-14, Feb. 8, 2005.

* cited by examiner

Primary Examiner — Steven J Mottola
(74) Attorney, Agent, or Firm — Cozen O'Connor

(57) ABSTRACT

An amplification arrangement comprises a signal-processing element (SVE) with an integrator element (INT) that is coupled on the input side with a first input (E1) for feeding the input signal and with a second input (E2) for feeding a feedback signal. The signal-processing element (SVE) is designed to set a respective level of the input signal and/or the feedback signal as a function of a control signal. The amplifier arrangement furthermore comprises a pulse modulator (PM) that is designed to generate a pulse signal on a pulse output (POT) as a function of a signal applied on the output (SOT) of the signal-processing element (SVE). An output stage (OST) comprises a switching element (SW) that is designed to connect supply-voltage terminals (V1, V2, GND) to an output terminal (OOT) that is coupled with an amplifier output (AOT) and the second input (E2), and a control unit (CU) for driving the switching element (SW) that is coupled with the pulse output (POT). A level control unit (PSE) is designed to generate the control signal such that the respective level in the signal-processing element (SVE) is reduced as a function of an overshooting of a specified pulse-duty factor of the pulse signal.

15 Claims, 4 Drawing Sheets

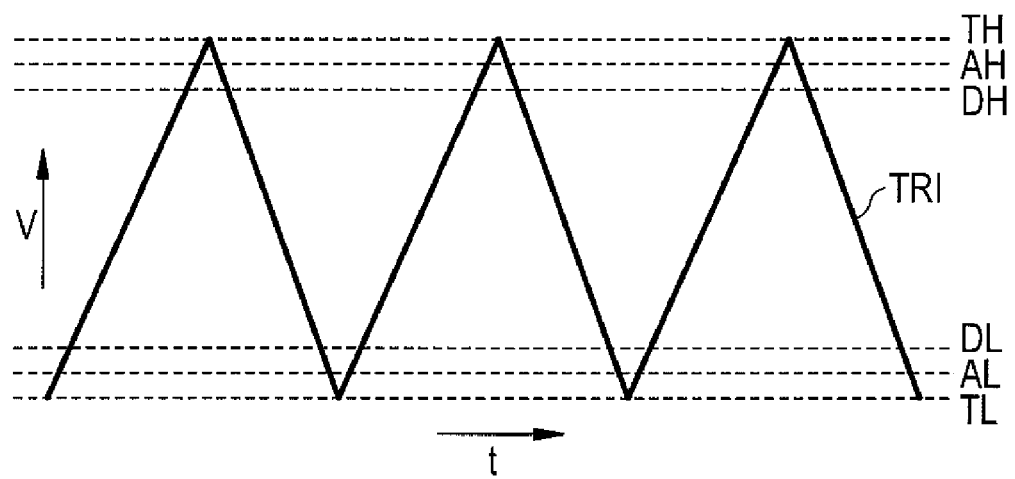
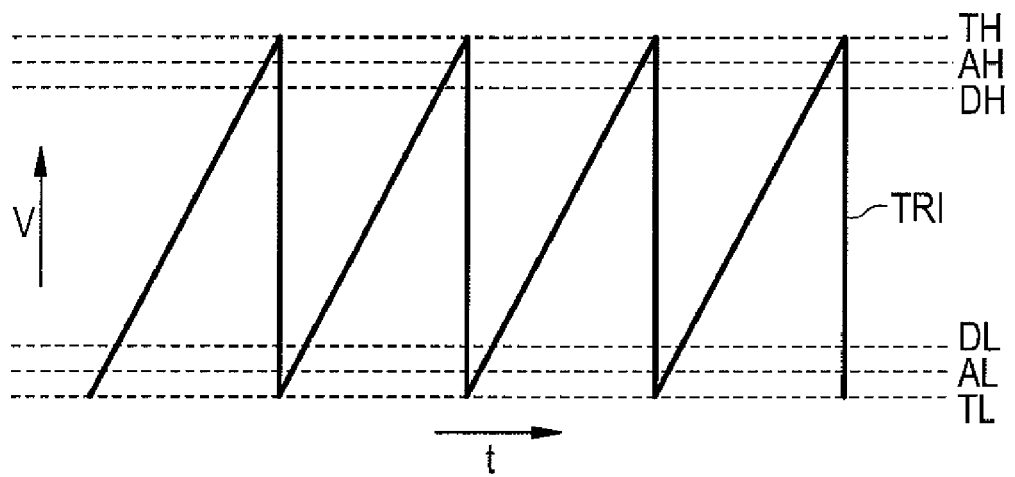

AMPLIFIER ARRANGEMENT AND METHOD FOR SIGNAL AMPLIFICATION

RELATED APPLICATIONS

This is a U.S. national stage of application No. PCT/EP2009/056473, filed on May 27, 2009.

This application claims the priority of German application no. 10 2008 027 765.7 filed Jun. 11, 2008, the entire content of which is hereby incorporated by reference.

FIELD OF THE INVENTION

The invention relates to an amplifier arrangement and to a method for signal amplification, with this arrangement and method being based on the principle of a switched amplification.

BACKGROUND OF THE INVENTION

Electronic amplifiers are often based on a class-A or class-AB principle in which an analog signal is amplified continuously in the single-phase or push-pull action by means of amplification elements, such as transistors. Today, however, electronic amplifiers that operate according to the class-D principle are increasingly being used. Such amplifiers could also be called switching amplifiers. In such amplifiers, an analog signal is converted, for example, by comparison with a triangular oscillation into a pulse-width-modulated, PWM signal. By means of the pulse-width-modulated signal, an active element is driven that couples supply connections to an output. Through the switching action, the efficiency of such an amplifier is improved relative to continuously amplifying amplifiers.

The signal processing within the switching amplifier here, however, depends on an available supply voltage. For example, the signal from which the pulse-width-modulated signal is derived can assume a level in which a constant signal that leads to distortion on the amplifier output is produced on the output of a PWM modulator used for this purpose. In addition, a loudspeaker that is connected, for example, to the amplifier output, could be damaged or destroyed by this constant signal. Furthermore, this could result in an unfavorable total harmonic distortion, THD, of the amplifier.

As a countermeasure, for example, additional pulses could be inserted into the PWM signal, wherein, however, the actual signal to be amplified is distorted. Alternatively, an input level of the PWM modulator could also be limited as a function of a minimum available supply voltage. However, through this measure, the input signal to be amplified is also reduced, which leads to a lower output power across the entire supply-voltage range.

SUMMARY OF THE INVENTION

It is an object of the invention to provide an amplifier arrangement and a method for signal amplification, with this arrangement and method allowing an improved signal quality even at higher powers for an amplification in the pulsed mode.

One embodiment of an amplifier arrangement comprises an amplifier input, an amplifier output, a signal-processing element, a pulse modulator, an output stage, and a level control unit. The signal-processing element has a first input that is coupled for feeding an input signal with the amplifier input, as well as a second input for feeding a feedback signal. The signal-processing element furthermore comprises a control input for feeding a control signal and an integrator element that is coupled on the input side with the first and second input and on the output side with an output of the signal-processing element. The signal-processing element is designed to set a respective level of the input signal or the feedback signal or the input signal and the feedback signal as a function of the control signal. The pulse modulator is designed to generate a pulse signal on a pulse output as a function of a signal applied on the output of the signal-processing element. The output stage comprises a switching element that is designed to connect supply-voltage terminals to an output terminal that is coupled with the amplifier output and the second input. The output stage further comprises a control unit for driving the switching element that is coupled with the pulse output. The level control unit is designed to generate the control signal such that the respective level in the signal-processing element is reduced as a function of an overshooting of a specified pulse-duty factor of the pulse signal on the pulse output.

In one embodiment, the pulse modulator has a comparison element, as well as a signal generator that is designed for the generation of a periodic oscillation, for example, a triangular oscillation or a sawtooth oscillation on a generator output. The comparison element is coupled on the input side with the output of the signal-processing element and the generator output and on the output side with the pulse output.

If the pulse signal overshoots the specified pulse-duty factor, this could theoretically lead to longer phases without switching processes in the output stage. The pulse-duty factor is here determined from the time ratio between high and low levels of the pulse signal, wherein, for example, reference is made to a period of the periodic oscillation. In the signal-processing element, the input signal and the feedback signal that is picked up on the output terminal of the output stage are guided with an adjustable level to the integrator element. In the level control unit, if the overshooting of the specified pulse-duty factor is detected, then the control signal for the signal-processing element is changed such that a level of the input signal or the feedback signal or of both is reduced. The reduced input signal on the integrator element consequently also leads to a reduced level of the integrated signal on the output of the integrator element. This in turn results in a changed pulse-duty factor of the pulse signal on the output of the pulse modulator. That is, because undesired constant signal portions in the pulse signal or in the output signal are avoided on the output terminal of the output stage, the signal quality of the output signal is improved, especially with respect to harmonic distortion. In addition, the improved signal quality could be achieved by means of a total available supply voltage range even for a maximum output power.

In one embodiment, the level control unit is coupled with the pulse output and designed to determine a pulse-duty factor of the pulse signal and to compare with the specified pulse-duty factor. For example, a change in level in the pulse signal is evaluated during a specified period. If there is no change in level, for example, then the level of the integrated signal is greater at each time of the period than a maximum value of a periodic oscillation or less than a minimum value of the periodic oscillation and thus outside of a useful or permissible range. In this case, the presence of a pulse-duty factor of 100% in the pulse signal is detected, which is higher than a specified pulse-duty factor that should be less than 100%. Accordingly, the control signal for the signal-processing element is adjusted with respect to a lower input level on the integrator element until, for example, pulses or edge changes occur again in the pulse signal.

In one alternative embodiment, the level control unit has a level input that is coupled with the output of the signal-processing element, as well as a level output that is coupled with the control input of the signal-processing element. The level control unit is here designed to generate the control signal such that the respective level in the signal-processing element is reduced as a function of a comparison of a signal on the level input with a first threshold value.

For example, the integrated signal on the output signal of the signal-processing element is compared with a first threshold value that lies by a predetermined value under the maximum value of a triangular oscillation. This first threshold value corresponds to a certain pulse-duty factor in the pulse signal. Consequently, if this first threshold value is exceeded, a specified pulse-duty factor is also exceeded, wherein this pulse-duty factor corresponds to a value less than 100%. Thus, when the first threshold value is reached or exceeded, an undesired constant signal is still not to be expected in the pulse signal. However, in order to prevent that the level of the integrated signal rises farther and exceeds the maximum value of the triangular oscillation, the input level on the integrator element is reduced accordingly.

The comparison of the integrated signal, however, could also be realized additionally or alternatively with a threshold value that lies above a minimum value of the triangular oscillation by a predetermined value. In this case, it is thus checked whether the integrated signal falls below this threshold value, in order to then cause a corresponding reduction of the level on the integrator input.

In other words, it is determined by the level control unit whether the integrated signal on the output of the integrator element is located in a boundary area between a threshold value and a maximum value or minimum value of the triangular oscillation, in order to trigger a reduction of the input level.

Furthermore, the level control unit could be designed to generate the control signal such that the reduction of the respective level in the signal-processing element is undone as a function of a comparison of the signal on the level input with a second threshold value.

For example, through a comparison of the integrated signal with the second threshold value it is determined whether, through the reduction of the level in the signal-processing element, the signal falls below a second threshold value that lies under the maximum value of the triangular oscillation and under the first threshold value. In this case, the reduction of the level in the signal-processing element can be undone, in order to allow a desired, higher level in the signal-processing element. Alternatively or additionally, it could also be checked whether the integrated signal is greater than another threshold value that lies above the minimum value of the triangular oscillation and above the lower threshold value from the previously mentioned embodiment. In this case, the reduction of the level in the signal-processing element could also be undone.

The undoing of the reduction could also be time-dependent in the different embodiments. For example, the level control unit is designed to generate the control signal such that the reduction of the respective level in the signal-processing element is undone after a predetermined time after the reduction.

For example, with each reduction of the level in the signal-processing element, a counter is triggered or reset that then measures a time since the last reduction process. If the predetermined time has elapsed without another reduction being performed, then the reduction can be undone. The undoing can be performed all at once or in steps. In addition, it is possible for the undoing of the reduction to be performed without condition. Alternatively, it could be provided that the undoing of the reduction is made dependent, for example, on the previously described comparison with the second threshold value.

In one embodiment of the amplifier arrangement, the signal-processing element has a preamplifier that is connected between the first input and the integrator element. The preamplifier is designed to adjust the level of the input signal as a function of the control signal.

For example, the input signal on the amplifier input is amplified by the preamplifier with a certain amplification factor. This amplification factor can be reduced by the control signal under the previously mentioned conditions, in order to reduce the level of the input signal on the integrator element.

Alternatively or additionally, the signal-processing element could have a digital-analog converter that is connected between the first input and the integrator element. In this case, the digital-analog converter is designed to set the level of the input signal as a function of the control signal. In this embodiment, the amplifier arrangement is designed for feeding a digital input signal on the amplifier input. This is converted by the digital-analog converter in the signal-processing element into a corresponding analog signal that has a level that can be adjusted by the control signal in the digital-analog converter. The output signal of the digital-analog converter could be fed directly to the integrator element or alternatively by means of a previously described preamplifier. The setting of the level of the input signal could be performed both in the digital-analog converter and also in the preamplifier.

In another embodiment, the signal-processing element has an impedance-based feedback network that is connected between the second input and the integrator element and is designed to set the level of the feedback signal as a function of the control signal. The feedback network could be constructed, for example, as a resistor-based voltage divider, wherein corresponding resistance values can be adjusted as a function of the control signal. Alternatively, however, reactive elements, such as capacitors or coils that simultaneously allow a filtering of the feedback signal could also be provided in the feedback network. Here, at least one of the reactive elements can be adjusted in its impedance value by the control signal.

The switching element in the output stage could comprise, for example, a transistor-based half bridge or a transistor-based full bridge. With a transistor-based half bridge, typically a positive or a negative supply voltage is passed through to the output terminal, each as a function of the pulse signal. As the reference voltage for the voltage on the output terminal, typically a ground potential or another potential is used that lies between two supply voltages. With a full bridge, by passing through a supply voltage to a differential output terminal, a differential output signal is generated.

The output terminal could be connected directly to the amplifier output or could be coupled by means of a low-pass filter.

In one embodiment of a method for signal amplification, an input signal is fed and combined with a feedback signal. The combined signal is integrated. A pulse signal is generated as a function of the integrated signal. An output signal is generated in which a supply voltage is switched in a controlled way as a function of the pulse signal. The feedback signal is generated from the output signal. A level value is determined as a function of a pulse-duty factor of the pulse signal. In the case of the described method, a respective level of the input signal and/or the feedback signal is reduced before the combining, when a pulse-duty factor corresponding to the level value overshoots a specified pulse-duty factor. Because a pulse-duty factor of the pulse signal is held within a permissible frame in the method by the reduction of the level of the input signal or of the feedback signal or of both, undesired constant signal portions in the pulse signal or in the output signal generated from this can be prevented. This leads to an improved signal quality of the output signal, because, in particular, harmonic distortion in the output signal is reduced or prevented.

An amplifier arrangement and a method for signal amplification according to one of the previously described embodiments are advantageously suitable for use in portable audio systems that should deliver a highest possible output power across a large supply-voltage range. In particular, for audio signals, the low harmonic distortion of the described embodiments has a positive effect. Examples for portable audio systems in which an amplifier arrangement can be used according to one of the described embodiments are MP3 players, mobile telephones, mobile radio devices, toys with audio functions, health products with audio functions, or other similar products.

BRIEF DESCRIPTION OF THE DRAWINGS

Several embodiments of the invention will be explained in detail below with reference to the figures. Elements with identical functions or action carry identical reference symbols. In so far as components correspond in their function, their description will not be repeated in each of the following figures.

Shown are.

DETAILED DESCRIPTION OF THE DRAWINGS

Figure 1:
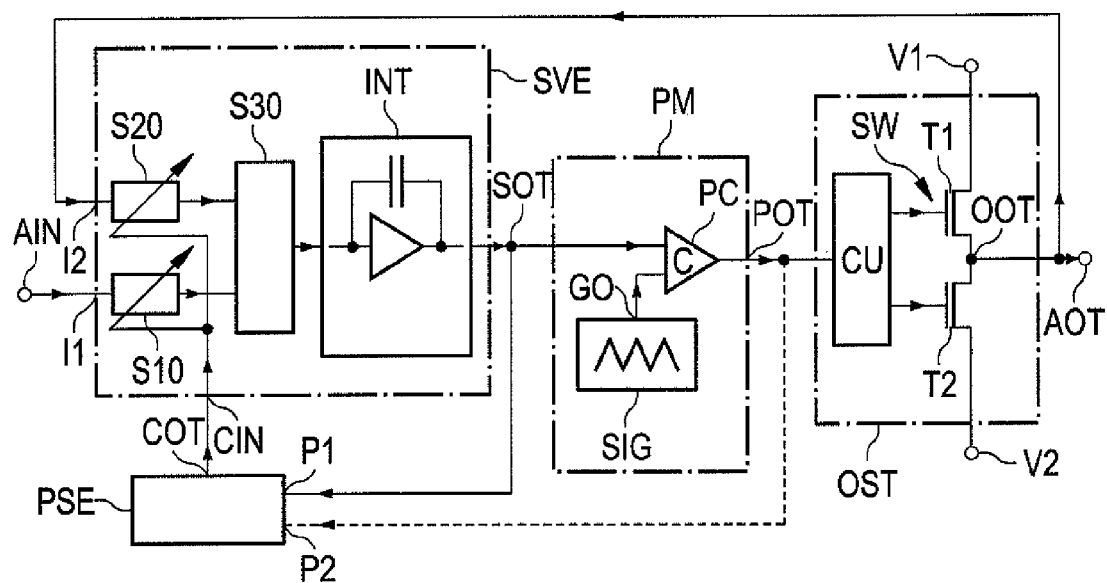
FIG. 1, a first embodiment of an amplifier arrangement,
FIG. 2, a signal-time diagram of a triangular oscillation,
FIG. 3, a signal-time diagram of a sawtooth oscillation,
FIG. 4, a second embodiment of an amplifier arrangement, and
FIG. 5, a third embodiment of an amplifier arrangement.

FIG. 1 shows an embodiment of an amplifier arrangement with a signal-processing element SVE that has a first input I1 coupled with an amplifier input AIN and a second input I2 coupled with an amplifier output AOT or an output terminal OOT of an output stage OST. An output SOT of the signal-processing element SVE is coupled with a pulse modulator PM whose pulse output POT is connected to a control unit CU of the output stage OST. The control unit CU is coupled with control terminals of transistors T1, T2 whose controlled paths are connected in series and together form a switching element SW. The series connection of the transistors T1, T2 is here connected between supply-voltage terminals V1, V2. A connection node of the transistors T1, T2 forms, the output terminal OOT of the output stage OST coupled with the amplifier output AOT.

The signal-processing element SVE has a first and a second level matching element S10, S20 that are coupled on the input side with the first and the second inputs I1, I2, respectively. Outputs of the level matching elements S10, S20 are connected to a combining element S30 that is coupled on the output side with an integrator element INT. One output of the integrator element INT is connected to output SOT of the signal-processing element SVE. The level matching elements S10, S20 are connected to a control input CIN for feeding a control signal for setting a respective level of the signals passing through them.

The pulse modulator PM has a signal generator SIG that is designed for the generation of a triangular oscillation on a generator output GO. A comparison element PC in the pulse modulator PM is coupled with the output SOT and the generator output GO and is connected on the output side to the pulse output POT.

A level control unit PSE has a level input P1 coupled with the output SOT and an evaluation input P2 coupled with the pulse output POT. A level output COT of the level control unit PSE is coupled with the control input CIN of the signal-processing element SVE.

In the operation of the amplifier arrangement, an input signal is fed by means of the amplifier input AIN and this input signal together with a feedback signal that is picked up from the output terminal OOT are fed by means of the level matching elements S10, S20 to the combination element S30. Here, the input signal or the feedback signal or both are adjusted in their level as a function of a control signal that is fed by means of the control input CIN. In the combination element S30, the input signal and the feedback signal are fed together by means of a weighted or non-weighted combination into a combined signal. For example, in the combining element S30, a sum of the input signal and feedback signal is formed. The combined signal on the output of the combining element S30 is integrated in the integrator element INT, wherein the integrated signal is output on the output SOT of the signal-processing element SVE. The integrator element INT could be realized as an integrator of first order or also higher order.

In the pulse modulator PM, the integrated signal is compared with a triangular oscillation that is generated by the signal generator SIG. The comparison is performed in the comparison element PC, for example, such that a logical high signal is output on the output of the comparison element PC when the instantaneous value of the integrated signal is greater than the instantaneous value of the triangular oscillation and a logical low signal for the case that the instantaneous value of the integrated signal is less than the instantaneous value of the triangular oscillation. Accordingly, a pulse-shaped pulse signal that is fed to the control unit CU in the output stage OST is produced on the pulse output POT.

In the embodiment, the switching element SW is constructed as a half bridge that is based on transistors T1, T2. Through corresponding driving of the transistors T1, T2 by the control unit CU as a function of the pulse signal, either a voltage on the first potential terminal V1 or a voltage on the second potential terminal V2 is switched through to the output terminal OOT. Because the transistors T1, T2 are either completely blocked or strongly conductive, apart from typically short switchover times, low power losses are produced in the operation of the switching element SW.

A pulse-duty factor of the pulse signal, that is, a ratio between high and low levels of the pulse signal with respect to a period specified by the triangular oscillation depends on the level of the integrated signal. For example, the pulse-duty factor is greater the higher the level of the integrated signal is. However, if a level has been reached by the integrate signal that is higher than a maximum value of the triangular oscillation or lower than a minimum value of the triangular oscillation, the comparison result on the output of the comparison element PC would remain unchanged, so that it would no longer result in pulses in the pulse signal. In other words, in this case, a specified or permissible pulse-duty factor would be exceeded.

Therefore, in the pulse control unit PSE, the integrated signal that is fed by means of the level input P1 is compared with a first threshold value that corresponds, for example, to the specified pulse-duty factor. If a comparison of the integrated signal with the first threshold results in that the specified pulse-duty factor is exceeded, that is, there is the possibility of an undesired constant signal on the pulse output POT, the control signal that is output on the level output COT is adjusted such that the respective level is reduced in the first and/or in the second level matching element S10, S20. Thus, the level of the combined signal on the input of the integrator element INT is reduced, which leads to a reduced level of the integrated signal. If the level reduction was sufficient, then the level of the integrated signal is changed so that a comparison with the first threshold value produces the result that the specified pulse-duty factor is maintained. Otherwise, the control signal could be adjusted with respect to another reduction of the level of the input signal or of the feedback signal until finally the first threshold is no longer reached.

Alternatively or additionally, in the level control unit PSE, the pulse signal applied on the evaluation input P2 could also be evaluated. For example, the pulse-duty factor of the pulse signal is determined and compared with the specified pulse-duty factor, in order to trigger the previously described reduction of the respective level in the signal-processing element SVE for an overshooting of the specified pulse-duty factor.

In one embodiment, for example, level changes or pulse flanks of the pulse signal are evaluated or detected in the level control unit PSE. If no level changes appear in the pulse signal, it is therefore assumed by the level control unit PSE that a pulse-duty factor of the pulse signal of at least 100% is reached and therefore undesired constant-signal portions appear in the pulse signal or in the output signal. In this case, the control signal is realized, in turn, with respect to the reduction of the level in the signal-processing element SVE.

If a reduction of the level in the signal-processing element or due to a high input level of the input signal has become necessary, the level of the integrated signal is expected to decrease for a reduced input level. A reduction of the level in the signal-processing element could no longer be absolutely necessary at this time. Therefore, in the level control unit PSE, a level of the integrated signal could be compared with a second threshold that corresponds to a lower pulse-duty factor than the specified pulse-duty factor for the reduction. If the pulse-duty factor of the pulse signal has fallen below this additional pulse-duty factor, then the reduction of the level can be undone in the signal-processing element.

The checking whether the pulse-duty factor has fallen below the additional pulse-duty factor could also be made time-dependent on a time of the reduction. For example, the control signal is adjusted only after a predetermined time so that the reduction is undone. The undoing of the reduction after the predetermined time could be performed both as a function of the comparison with the second threshold value and also independent of such a comparison.

In both cases, the time of the undoing of the reduction should be made dependent on a time of the last necessary reduction. The undoing of the reduction can be performed here in one or more steps.

In the described embodiments, because the level of the signals in the signal-processing element SVE is adjusted when a specified pulse-duty factor is exceeded, the appearance of undesired constant signal portions in the pulse signal or in the output signal is reduced or prevented. Therefore, less harmonic distortion is produced in the output signal, which has a positive effect, in particular, on the total harmonic distortion THD. The signal quality of the amplifier arrangement is thus improved.

FIG. 2 shows a signal-time diagram of a triangular oscillation TRI. A voltage V of the triangular oscillation TRI increases uniformly or decreases uniformly in this signal example in the time progression t, wherein a value TH is reached as a maximum value and a value TL is reached as a minimum value. In addition, in the diagram, first threshold values AH, AL are shown that lie below the maximum value TH or above the minimum value TL by a predetermined value. Correspondingly, second threshold values DH, DL are also shown that lie, in turn, below the first threshold AH or above the first threshold AL.

With reference to the statements on FIG. 1, for example, the level in the signal-processing element is reduced, when the integrated signal exceeds the threshold value AH or falls below the threshold value AL. If, due to the reduction, the level of the integrated signal falls below the threshold value DH or increases past the threshold value DL, the reduction of the level in the signal-processing element can be undone.

In other words, the integrated signal is compared with signal ranges that are defined by the values AH and TH, AL and TL, and also DH and DL, in order to trigger or to undo a corresponding reduction.

FIG. 3 shows a signal-time diagram of another triangular oscillation TRI that has a sawtooth-shaped progression. This triangular oscillation can therefore also be called a sawtooth oscillation. Here, the triangular oscillation increases uniformly from a minimum value TL to the maximum value TH and, when it reaches the maximum value TH, it falls immediately back to the minimum value TL. Alternatively, the sawtooth oscillation TRI could also comprise a uniform decrease of the signal with immediate increase when the minimum value TL is reached.

Figure 4:
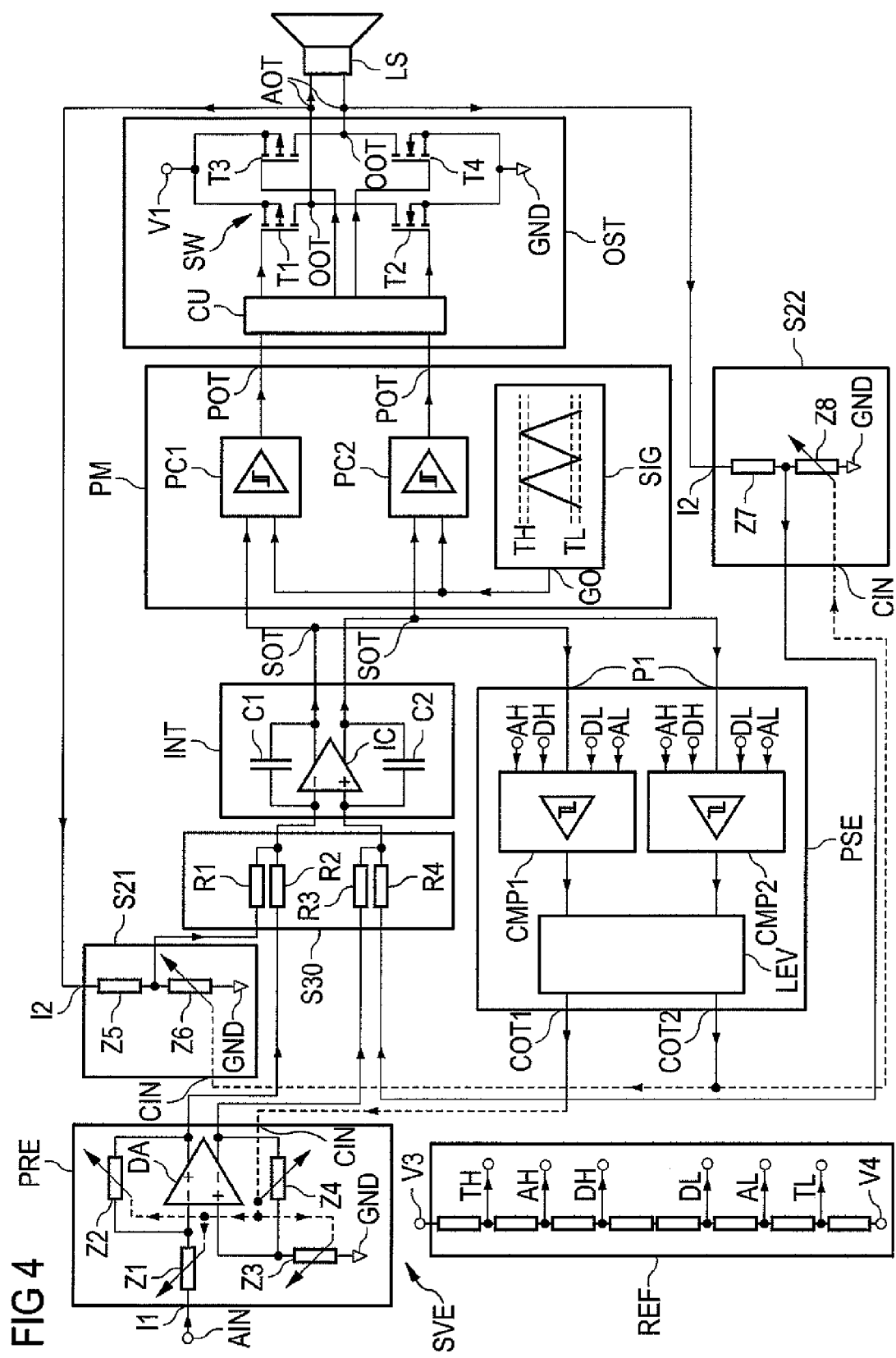

FIG. 4 shows another embodiment of an amplifier arrangement that is based essentially on the amplifier arrangement shown in FIG. 1. In this embodiment, the signal-processing element SVE comprises a preamplifier PRE that is connected on the input side to the amplifier input AIN and couples the first input I1 with the integrator element INT. The signal-processing element further comprises feedback networks S21, S22 that couple the output terminal OOT with the combination element S30 and the integrator element INT, respectively.

The preamplifier PRE comprises a differential amplifier that is connected to impedances Z1, Z2, Z3, Z4 and whose inverting input is coupled with the first input I1. A non-inverting input of the amplifier is connected to a reference-potential terminal GND by means of the impedance element Z3. The impedance elements Z1 to Z4 can be adjusted in their impedance value and couples in this respect with the control input CIN or a level output COT1 of the level control unit PSE. In the shown embodiment, the preamplifier PRE converts the input signal on the amplifier input AIN into a differential signal. Alternatively, a differential signal could also be fed directly to the preamplifier PRE on the input side.

The feedback networks S21, S22 are based on the impedance elements Z5, Z6, Z7, Z8. They each comprise impedance-based voltage dividers, wherein a level of the signal fed back by means of the feedback networks S21, S22 to the combination element S30 depends on an impedance ratio of the impedance elements Z5, Z6, and also Z7, Z8. The impedance value of the impedance elements Z6, Z8 is here adjustable by a control signal that is output on the level output COT2 of the level control unit. Thus, the level of the feedback signal can be adjusted as a function of the control signal.

The impedance elements Z1 to Z8 of the preamplifier PRE and the feedback networks S21, S22 could be both purely resistor-based and could also comprise capacitive and/or inductive elements. For the use of inductive and/or capacitive elements, a filtering effect could thus be simultaneously achieved. The adjustable impedance elements are constructed, for example, as an impedance chain or as a resistance chain with controlled, switched tap, each as a function of the control signal. Alternatively, the adjustable impedance elements could also be realized by means of transistors controlled in their resistance value. However, other known switchable resistors or impedance elements could also be used.

In the combination element S30, the differential input signal and the differential feedback signal are combined by means of resistors R1, R2, R3, R4. The resistance values of the resistors R1 to R4 could be equal or could be different for a corresponding weighting.

The integrator element INT comprises a differential integration amplifier IC that is fed back by means of capacitive elements C1, C2. The differential, integrated signal is fed onto comparison elements PC1, PC2 in the pulse modulator PM that perform, for each of the differential signal branches, a comparison with the triangular oscillation from the signal generator SIG.

In this embodiment, the output stage OST comprises a transistor-based full bridge with transistors T1, T2, T3, T4 that are driven by the control unit CU as a function of the pulse signal on the pulse output POT. The full bridge thus forms a switching element SW. Through corresponding driving, either a voltage applied on the supply terminal V1 or a voltage applied on the reference-potential terminal GND is switched through onto the output terminal OOT that is formed by nodes of the transistors T1, T2 and also of the transistors T3, T4. In this embodiment, a loudspeaker LS that is contained, for example, by a loudspeaker system or by a headset is connected to the amplifier output AOT that is coupled with the output terminal OOT. The coupling of the loudspeaker LS to the amplifier output AOT can be realized by means of a low-pass element. However, the low-pass effect of the loudspeaker LS could also be sufficient for suppressing undesired switching noises.

A differential level input P1 of the level control unit PSE is connected, in turn, to the output SOT of the signal-processing element SVE. The level control unit PSE comprises additional comparison elements CMP1, CMP2 to which the integrated, differential signal, as well as threshold value signals AH, AL, DH, DL are fed. Comparison results of the comparison elements CMP1, CMP2 are fed to an evaluation unit LEV that adjusts the control signal on the level output COT1, COT2 as a function of the comparison results. A reduction of the level in the signal-processing element SVE or an undoing of the appropriate reduction is performed analogous to the embodiment described for FIG. 1.

In the amplifier arrangement, a reference voltage generator REF is also provided that generates signal levels for the maximum and minimum values TH, TL, as well as for the threshold values AH, AL, DH, DL that can be used in the level control unit PSE and in the signal generator SIG as a function of voltages fed by means of the voltage terminals V3, V4. The reference voltage generator REF can also comprise, for example, a bandgap circuit that is not shown here and has available one or more of the required voltages.

Figure 5:
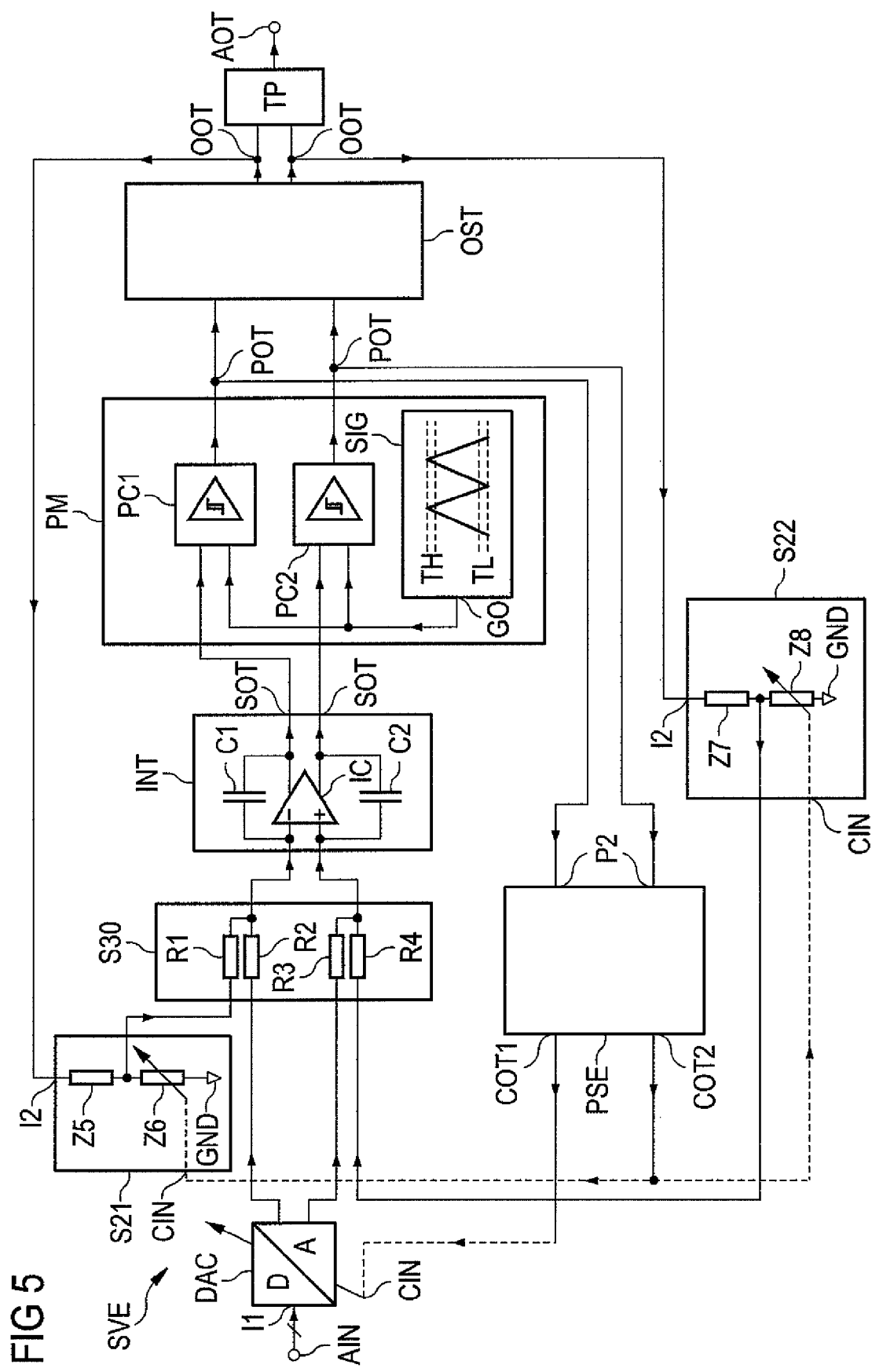

FIG. 5 shows another embodiment of an amplifier arrangement in which the signal-processing element SVE has, deviating from the embodiment in FIG. 4, a digital-analog converter DAC that couples the first input I1 with the integrator element INT. The digital-analog converter DAC could be set with respect to its output level by means of a control signal on the control input CIN. In this embodiment, the input signal is fed as a digital signal on the amplifier input AIN and converted by means of the digital-analog converter DAC into a differential, analog input signal with corresponding input level.

A preamplifier PRE as shown in FIG. 4 could also be provided in this embodiment, for example, between the digital-analog converter DAC and the combination element S30.

The amplifier output AOT is coupled in this embodiment with the output terminal OOT by means of a low-pass filter TP, in order to filter out the high-frequency signal components of the pulsed output signal of the output stage OST.

In the shown embodiment, the level control unit PSE has the evaluation input P2 that is coupled with the pulse output POT. Consequently, as explained in detail above for FIG. 1, the pulse-duty factor of the pulse signal is evaluated directly, in order to perform the adjustment of the level in the signal-processing element SVE. Here, either the level of the input signal or the level of the feedback signal or both levels could be adjusted.

In the described embodiments of the amplifier arrangement, because a level of the signals in the signal-processing element SVE is reduced only when the specified pulse-duty factor is exceeded and this reduction is advantageously undone again as soon as possible, it is possible to achieve a maximum output power with low harmonic distortion. This is also possible for oscillating supply voltages. Through the indirect adjustment of the level of the integrated signal, furthermore a voltage range defined by the maximum value and minimum value of the triangular oscillation can be almost completely utilized. Furthermore, an amplifier arrangement according to one of the described embodiments could be easily integrated into a system in which a large input dynamic ratio is required for the input signal of the amplifier.

In the described embodiments, the generation of the pulse signal could also be performed in a different way than through comparison with a periodic signal.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An amplifier arrangement, comprising:
an amplifier input;
an amplifier output;
a signal-processing element with a first input that is coupled with the amplifier input for feeding an input signal, a second input for feeding a feedback signal, a control input for feeding a control signal, and an integrator element that is coupled on the input side with the first and second input and on the output side with an output of the signal-processing element, wherein the signal-processing element is adapted to set a respective level of the input signal and/or the feedback signal as a function of the control signal;
a pulse modulator that is adapted to generate a pulse signal on a pulse output as a function of a signal applied on the output of the signal-processing element;
an output stage with a switching element that is adapted to connect supply-voltage terminals to an output terminal that is coupled with the amplifier output and the second input, and a control unit for driving the switching element that is coupled with the pulse output;
a level control unit that is designed to generate the control signal such that the respective level in the signal-processing element is reduced as a function of an overshooting of a specified pulse-duty factor of a pulse signal on the pulse output; and wherein the level control unit is coupled with the pulse output and is adapted to determine a pulse-duty factor of the pulse signal and to compare it with the specified pulse-duty factor.

2. The amplifier arrangement according to claim 1, wherein the level control unit has a level input that is coupled with the output of the signal-processing element and a level output that is coupled with the control input and is adapted to generate the control signal such that the respective level in the signal-processing element is reduced as a function of a comparison of a signal on the level input with a first threshold value.

3. The amplifier arrangement according to claim 2, wherein the level control unit is adapted to generate the control signal such that the reduction of the respective level in the signal-processing element is undone as a function of a comparison of the signal on the level input with a second threshold value.

4. The amplifier arrangement according to claim 1, wherein the level control unit is adapted to generate the control signal such that the reduction of the respective level in the signal-processing element is undone after a predetermined time after the reduction.

5. The amplifier arrangement according to claim 1, wherein the signal-processing element has a preamplifier that is connected between the first input and the integrator element and is adapted to set the level of the input signal as a function of the control signal.

6. The amplifier arrangement according to claim 1, wherein the signal-processing element has a digital-analog converter that is connected between the first input and the integrator element and is adapted to set the level of the input signal as a function of the control signal.

7. The amplifier arrangement according to claim 1, wherein the signal-processing element has an impedance-based feedback network that is connected between the second input and the integrator element and is adapted to set the level of the feedback signal as a function of the control signal.

8. The amplifier arrangement according to claim 1, wherein the switching element comprises a transistor-based half bridge or a transistor-based full bridge.

9. The amplifier arrangement according to claim 1, wherein the pulse modulator has a signal generator that is adapted for the generation of a periodic oscillation on a generator output and a comparison element that is coupled on the input side with the output of the signal-processing element and the generator output and on the output side with the pulse output, wherein the periodic oscillation comprises triangular oscillation or sawtooth oscillation.

10. The amplifier arrangement according to claim 1, wherein the output terminal is coupled with the amplifier output by a low-pass filter.

11. A method for signal amplification, comprising the steps of:
feeding of an input signal;
combination of the input signal with a feedback signal;
integration of the combined signal;
generation of a pulse signal as a function of the integrated signal;
generation of an output signal through controlled switching of a supply voltage as a function of the pulse signal;
generation of the feedback signal from the output signal;
calculation of a level value as a function of a pulse-duty factor of the pulse signal; and
determining a pulse-duty factor of the pulse signal and comparing the determined pulse-duty factor with a specified pulse-duty factor such that a respective level of the input signal and/or the feedback signal is reduced before the combining when the determined pulse-duty factor corresponding to the level value overshoots the specified pulse-duty factor.

12. The method according to claim 11, wherein determining the level value comprises a comparison of the integrated signal with a first threshold value.

13. The method according to claim 12, wherein the reduction of the respective level is undone as a function of a comparison of the integrated signal with a second threshold value.

14. The method according to claim 11, wherein the reduction of the respective level is undone after a predetermined time after the reduction.

15. The method according to claim 11, wherein the generation of the pulse signal comprises a comparison of the integrated signal with a triangular oscillation or a sawtooth oscillation.

* * * * *